United States Patent [19]

Ohashi et al.

[11] Patent Number: 5,764,483
[45] Date of Patent: Jun. 9, 1998

[54] COOLING UNIT FOR ELECTRONIC EQUIPMENT

[75] Inventors: Shigeo Ohashi; Toshio Hatada, both of Tsuchiura; Shinji Tanaka, Ushiku, all of Japan

[73] Assignee: Hitachi, Ltd., Japan

[21] Appl. No.: 730,441

[22] Filed: Oct. 15, 1996

Related U.S. Application Data

[63] Continuation of Ser. No. 339,267, Nov. 10, 1994, abandoned.

[30] Foreign Application Priority Data

Nov. 15, 1993 [JP] Japan ................. 5-284855

[51] Int. Cl.$^6$ ................................. H05K 7/20
[52] U.S. Cl. ............... 361/699; 165/104.33; 257/714; 361/687; 417/92; 417/377
[58] Field of Search ............... 62/418, 419, 426, 62/259.2; 257/706, 707, 712–714; 165/80.4, 185, 104.22, 104.33, 46; 174/15.1, 15.2, 16.3; 415/114, 177, 178; 417/13, 44.8, 92, 366, 377; 361/687, 699, 700–706, 711, 717–719

[56] References Cited

U.S. PATENT DOCUMENTS

| | | | |
|---|---|---|---|
| 4,980,848 | 12/1990 | Griffin | 364/708 |
| 5,000,256 | 3/1991 | Touisignant | 165/46 |
| 5,289,342 | 2/1994 | Spalding | 361/699 |
| 5,313,362 | 5/1994 | Hatada | 361/709 |
| 5,343,358 | 8/1994 | Hilbrink | 361/700 |
| 5,383,340 | 1/1995 | Larson | 62/259.2 |
| 5,390,734 | 2/1995 | Voorhes | 165/185 |
| 5,394,936 | 3/1995 | Budelman | 165/104.33 |
| 5,458,189 | 10/1995 | Larson | 165/104.33 |

FOREIGN PATENT DOCUMENTS

| | | | |
|---|---|---|---|
| 128584 | 10/1979 | Japan | 361/700 |
| 55-71092 | 5/1980 | Japan . | |
| 63-250900 | 10/1988 | Japan . | |
| 3-255697 | 11/1991 | Japan . | |
| 404320399 | 11/1992 | Japan | 361/700 |
| 5-29153 | 4/1993 | Japan . | |

*Primary Examiner*—Gerald P. Tolin
*Attorney, Agent, or Firm*—Evenson, McKeown, Edwards & Lenahan, P.L.L.C.

[57] ABSTRACT

Heat generated at heat generating components is efficiently transported to a wall of a metal box serving as a heat dissipation section to cool the heat generating components even in an apparatus, in which box the heat generating components together with other components are mounted. The heat generating components and the heat dissipation section are connected to each other through a thermal transport device having a flexible structure. The heat generating components and the box are readily connected to each other irrespective of the arrangement of components, and heat is efficiently transported by driving the liquid. In the heat dissipation section, because the heat generating components and the wall of the metal box are thermally connected to each other, a high heat dissipation capacity is obtained as heat is diffused extensively into the wall due to a high thermal conductivity of the metal box.

7 Claims, 10 Drawing Sheets

F I G. 4
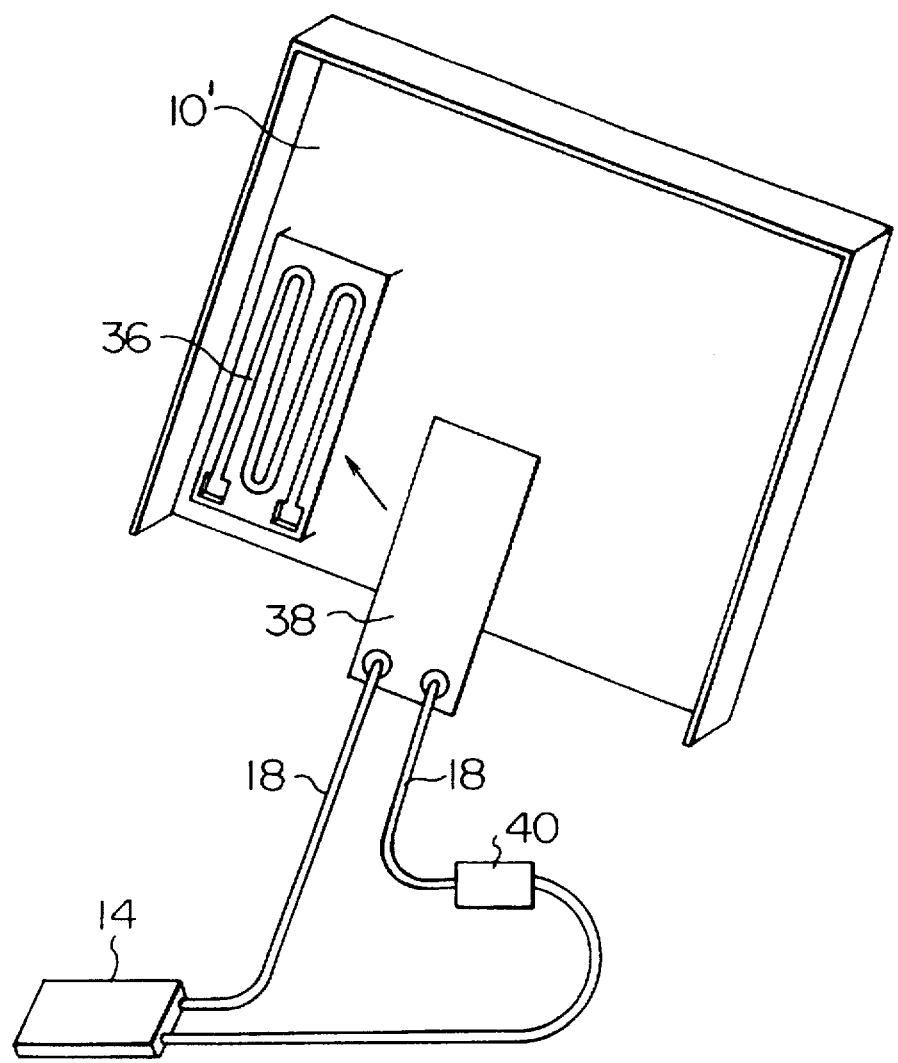

F I G. 6
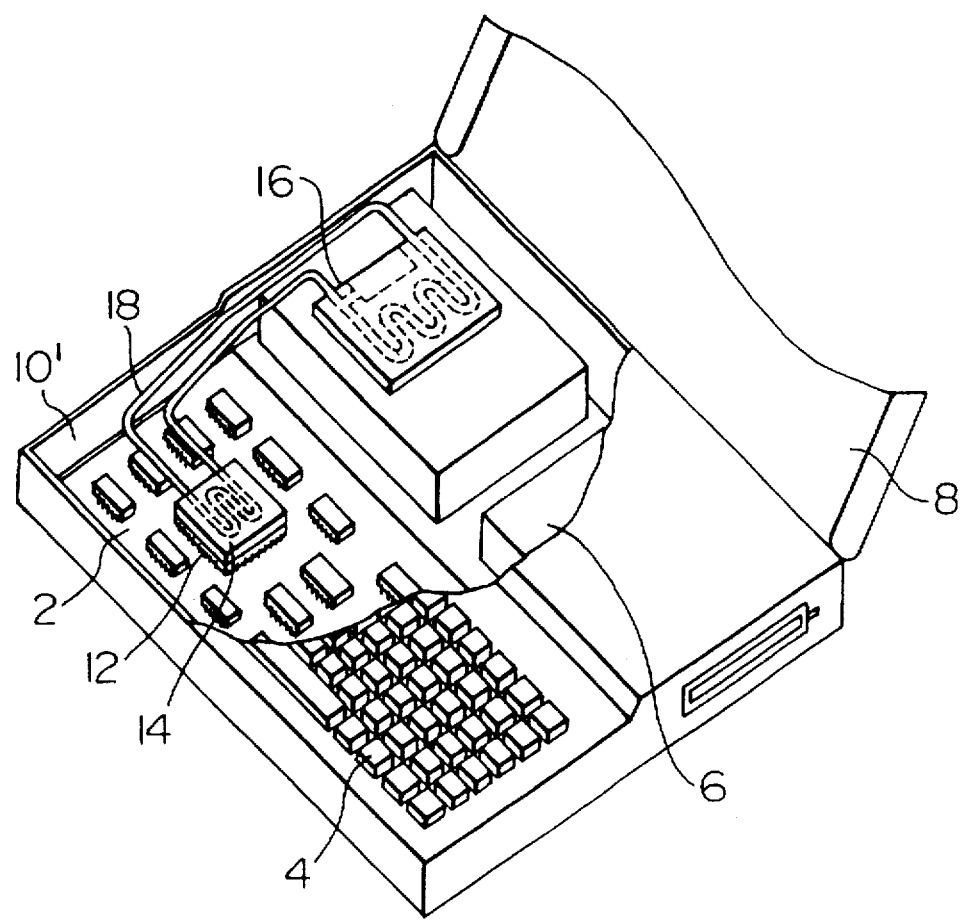

COOLING UNIT FOR ELECTRONIC EQUIPMENT

This application is a continuation of application Ser. No. 08/339,267, filed on Nov. 10, 1994 now abandoned.

BACKGROUND OF THE INVENTION

The present invention relates to cooling units for electronic equipment and, more particularly, relates to a cooling unit for electronic equipment suitably used in cooling an electronic circuit board, which is adapted to cool semiconductor devices to maintain a predetermined temperature thereof.

In a conventional electronic apparatus, as disclosed in Japanese Patent Unexamined Publication No. 63-250900, Japanese Patent Unexamined Publication No. 3-255697 and Japanese Utility Model Unexamined Publication No. 5-29153, an independent metal plate or a metal plate constituting a part of a box is placed between heat generating components and a wall of a metal box so that heat generated at the heat generating components is dissipated as it is transported by means of thermal conduction to the metal box wall which serves as a heat dissipation section. Also, as disclosed in Japanese Patent Unexamined Publication No. 55-71092, a heat pipe is formed on the surface of a metal box wall to thermally connect heat generating components to the metal box wall surface, so that heat generated at the heat generating components is dissipated through the metal box wall.

In the above conventional example of Japanese Patent Unexamined Publication No. 63-250900, Japanese Patent Unexamined Publication No. 3-255697 and Japanese Utility Model Unexamined Publication No. 5-29153, heat conduction is not efficient, since the heat transfer path from the heat generating components to the metal box wall is constituted only by a thin cross-sectional area of the box wall having a thickness of about 1 mm. It has thus been unable to adequately respond to an increase in generation of heat. Further, depending on the arrangement of components, the distance of conduction to the metal box wall is not always short. For this reason, arrangement of components and structure of the box body have been limited, for example, by disposing heat generating components close to the box body. On the other hand, in those electronic equipments from which high performance is expected, arrangement of components including a heat generating component largely affects the performance, for example, in respect of wiring length which is related to higher electronic circuit speed. For this reason, with the conventional example, compact arrangement and higher performance of the electronic equipment have been encumbered. In the example of Japanese Patent Unexamined Publication No. 55-71092, too, arrangement of components including the heat generating components or box structure is limited, since the heat generating components must be directly connected to the metal box wall. For this reason, if priority is on achieving an optimal arrangement of components, such measures as providing of radiation fins individually on the heat generating components becomes necessary, whereby the size of box is necessarily increased.

It is an object of the present invention to provide a cooling unit for electronic equipment to cool heat generating components to a predetermined temperature, in which heat generated at the heat generating components is efficiently transported to a metal box wall which serves as a heat dissipation section, irrespective of arrangement of components even in an apparatus, in which the heat generating components are packed together with other components within a small space.

SUMMARY OF THE INVENTION

To achieve the above object, in a cooling unit for electronic equipment of the present invention, a metal box wall is provided as a heat dissipation section and heat generating components and the metal box wall are thermally connected to each other through a thermal transport means having a flexible structure. The thermal transport means comprises: a flat header member attached to the heat generating components and having an internally formed liquid flow path; a heat dissipation section having a liquid flow path placed in contact with the metal box wall or formed integral with the metal box wall; and a flexible tube connecting the two portions to each other; and a liquid drive mechanism is provided to effect a liquid vibration or liquid circulation of an internally sealed liquid between the header attached to the heat generating component and the heat dissipation portion.

Further, a heat receiving plate attached to the heat generating component or components and a metal box wall are connected to each other through a heat pipe having a small diameter which is bent in accordance with arrangement of components.

Furthermore, a wiring board having a plurality of heat generating components mounted thereon is disposed to face a metal box wall and a member which is flexible and has a high thermal conductivity is inserted between the heat generating components and the metal box wall.

According to the above construction, the cooling unit for electronic equipment of the present invention uses a flexible tube for the connection between a header provided in contact with the heat generating component and a heat dissipation member provided in contact with the metal box wall or formed integral with the metal box wall. The heat generating component and the box wall serving as a heat dissipation section are thus readily connected to each other and heat is transported efficiently by means of driving of the liquid, irrespective of component arrangement even in the state where a large number of components are mounted within a very narrow box. Since, at the heat dissipation section, the heat dissipation member and the metal box wall are thermally connected to each other, heat is diffused extensively into the box wall and a high heat dissipation capacity may be obtained due to high thermal conductivity of the metal box body. Accordingly, a semiconductor device may be efficiently cooled.

Further, by connecting the heat generating component and the metal box wall through a small-diameter heat pipe which is bent in accordance with arrangement of components, heat generated at the heat generating component may be efficiently transported to the metal box wall irrespective of the component arrangement. At the heat dissipation section, a large heat dissipation capacity may be obtained as the heat is diffused extensively into the box wall due to a high thermal conductivity of the metal box body. Accordingly, a semiconductor device may be efficiently cooled.

Furthermore, since a plurality of heat generating components and the metal box wall are connected to each other through a flexible member, each heat generating component and the metal box wall is thermally connected efficiently to each other even if height of the heat generating component varies from one to another. In addition, a large heat dissipation capacity may be obtained as the heat is diffused extensively into the box wall due to a high thermal conductivity of the metal box body. Accordingly, a semiconductor device may be efficiently cooled.

BRIEF DESCRIPTION OF THE DRAWINGS

FIG. 4 illustrates the construction of a third embodiment of the present invention.

FIG. 5A is an isolated enlarged cross-sectional view of the U-shaped groove used in the embodiment of FIG. 5.

FIG. 6 is a perspective view of a fifth embodiment of the present invention.

FIG. 7A is an isolated enlarge cross-sectional view of the U-shaped groove used in the embodiment of FIG. 7.

DESCRIPTION OF THE PREFERRED EMBODIMENTS

Some embodiments of the present invention will now be described with reference to the drawings.

Figure 1:
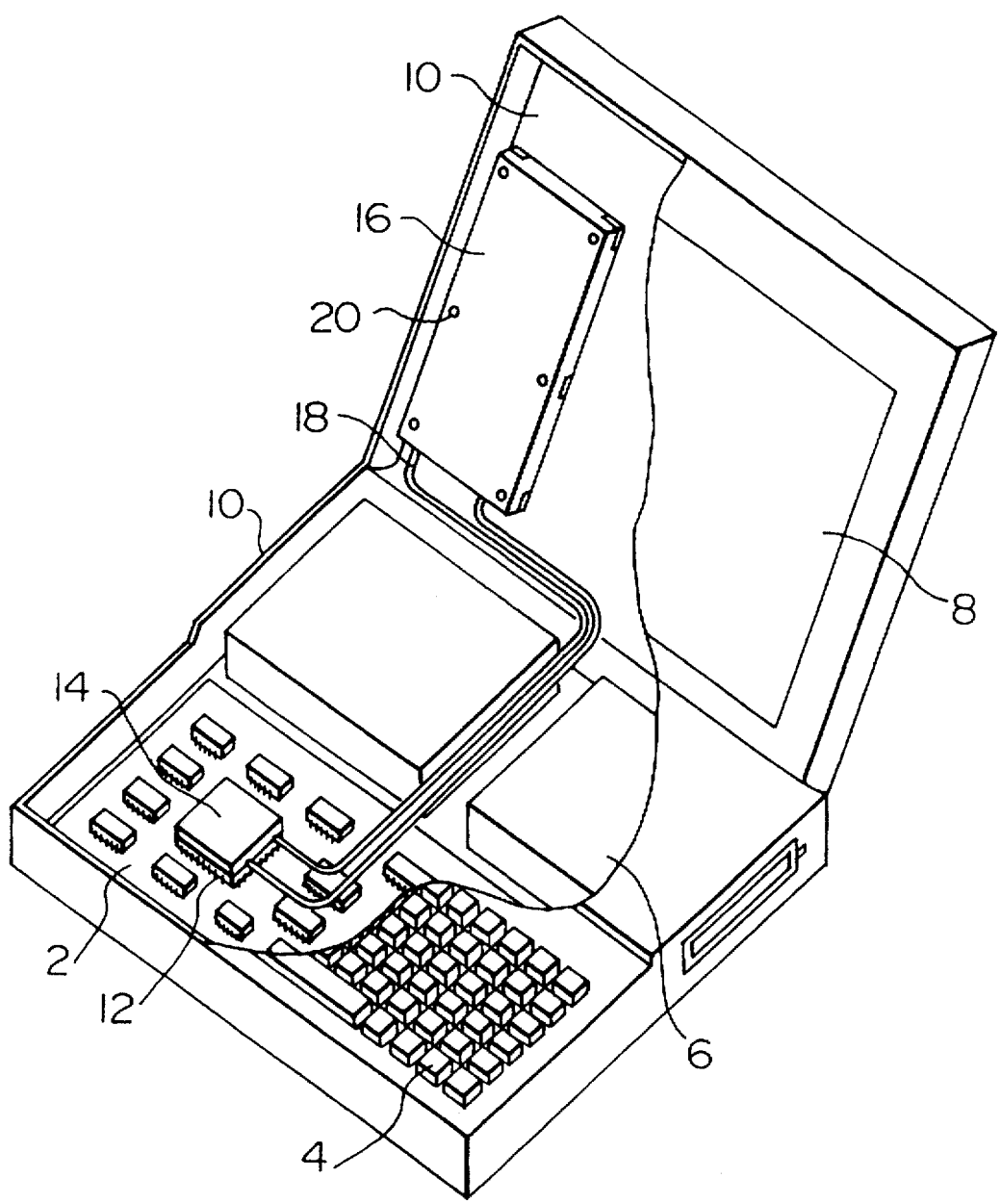
FIG. 1 is a perspective view of a first embodiment of the present invention.

FIG. 1 shows a first embodiment of the present invention.

An electronic equipment here includes a wiring board 2 having a plurality of semiconductor devices mounted thereon, a key board 4, a disk unit 6 and a display unit 8 and is contained in a metal box consisting of a lower box 10 containing the semiconductor devices and an upper box 10' containing the display unit 8. Of these semiconductor devices mounted on the wiring board 2, a semiconductor device 12 having a particularly large generation of heat is cooled by a thermal transport device which is constituted by a heat receiving header 14, a heat dissipation header 16, a flexible tube 18, etc. As illustrated, the semiconductor device 12 and the heat receiving header 14 are brought into contact with each other through a thermal compound or high heat conduction silicone rubber interposing therebetween so that heat generated at the semiconductor device 12 is efficiently transferred to the heat receiving header 14. Further, the heat receiving header 14 connected to the semiconductor device 12 is connected through the flexible tube 18 to the heat dissipation header 16 which is provided on a box wall of the back side portion of the display unit 8. The heat dissipation header 16 is thermally and physically attached to the metal box wall through a thermal compound or high heat conduction silicone rubber or directly, for example, by means of screw 20.

Formed at the interior of the heat receiving header 14 and the heat dissipation header 16 is a flow passage into which a liquid is sealed. Further, a liquid driver is incorporated into the heat dissipation header 16 so that the liquid is driven between the heat receiving header 14 and the heat dissipation header 16. Such driving of a liquid may be performed either in reciprocation or circulation between the two parts. Since the heat receiving header 14 and the heat dissipation header 16 are connected to each other through a flexible tube, the semiconductor device having a high generation of heat and the box wall serving as a heat dissipation section may be readily connected to each other irrespective of the mounting structure even in the state where a large number of components are mounted within a box which is very narrow in space. In addition, since thermal transport is performed by driving of a liquid, heat generated at the semiconductor device having a high generation of heat is effectively transferred to the heat dissipation header. Since, at the dissipating portion, the heat dissipation header is thermally connected to the metal box wall, a high heat dissipation capacity may be obtained as the heat is diffused extensively into the box wall due to a high thermal conductivity of the metal box. Accordingly, the semiconductor device may be efficiently cooled.

Figure 2:
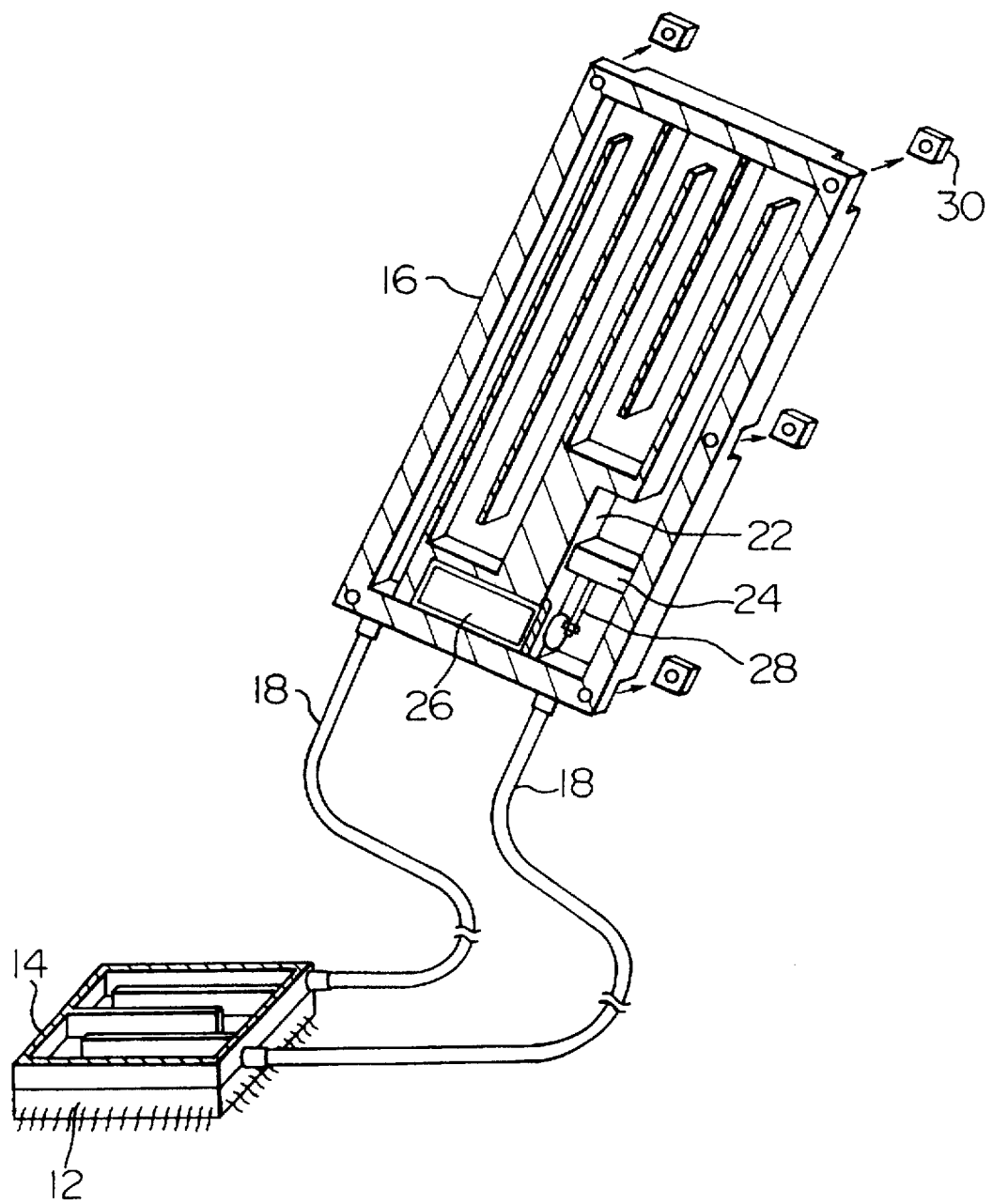
FIG. 2 is a detailed perspective view of the embodiment of FIG. 1.

FIG. 2 shows in detail the thermal transport device used in FIG. 1. Fins are provided in the interior of the heat receiving header 14 and the heat dissipation header 16 so that a liquid passage is formed and heat is efficiently transferred from the header wall to the liquid in the interior thereof. Further, the heat dissipation header 16 has a liquid driving mechanism in the interior thereof. The heat receiving header 14 may be of any size corresponding to the size of a heat generating component such as the semiconductor device 12 (also referred to as heat generating component) and is thermally connected to the heat generating component, for example, by means of physical contact. Also, it may be constructed such that a metal pipe is welded to a metal plate (such copper or aluminum). On the other hand, the liquid driving mechanism in the interior of the heat dissipation header is shown by way of example in the form of a mechanism in which a portion of the flow passage is provided by a cylinder 22 and a piston 24 is reciprocated by means of a motor 26 and a link mechanism 28. While the heat dissipation header 16 is attached to a wall of the metal box 10, a boss 30 for screwing may be integrally formed on the box wall as an attaching structure at the time of die casting. Further, the flexible tube 18 for connecting the heat receiving header 14 and the heat dissipation header 16 may be of a resin and has an inner diameter on the order of 2 mm. Therefore, both the heat receiving header 14 and the heat dissipation header 16 may be reduced in thickness and even a semiconductor device having a high generation of heat mounted within a narrow space may be effectively cooled.

Figure 3:
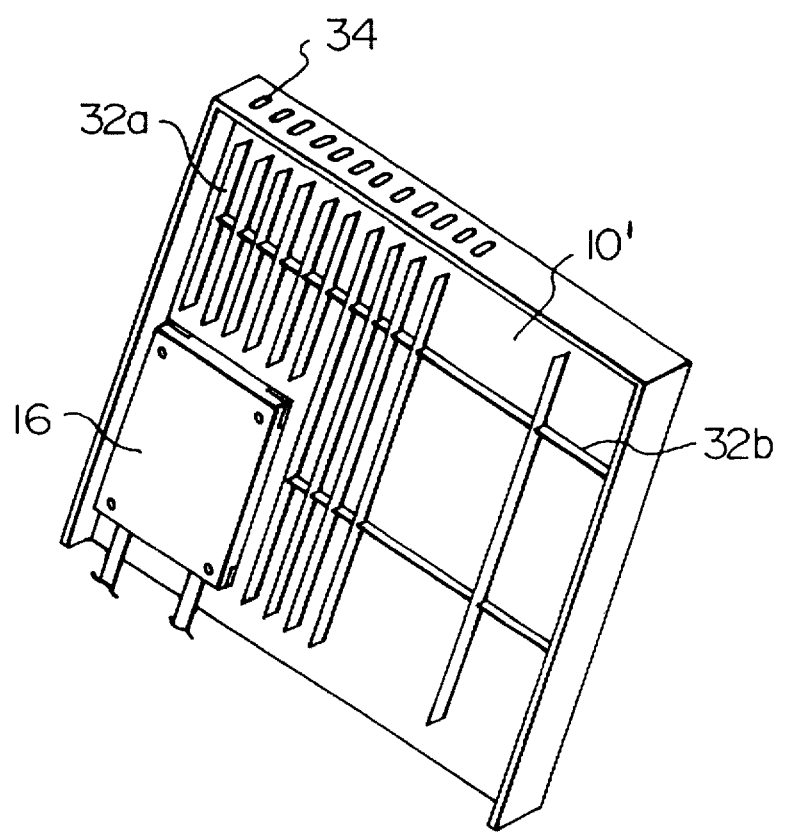
FIG. 3 is a perspective view of a second embodiment of the present invention.

FIG. 3 shows a second embodiment of the present invention.

In this embodiment, fins 32a, 32b are provided in a manner to be integrally formed on the inner side of the box on the display unit side of the metal box 10' to which the heat dissipation header 16 is attached. Height of the fin 32a is of the same order as the thickness of the heat dissipation header 16, so as not to cause an obstacle in attaching the display unit. Further, by providing the fins perpendicularly to each other, it is possible to impart a high rigidity to the box. However, the fin 32b which is placed in the horizontal direction when the equipment is used is provided to be lower in height than the fin 32a which lies in the vertical direction, so as not to impede a rising air flow due to natural convection. Further, air holes 34 are provided on the box to promote heat dissipation based on natural convention.

FIG. 4 shows a third embodiment of the present invention.

In this embodiment, a flow passage 36 of the heat dissipation header for constituting the thermal transport device is formed directly on a wall surface of the metal box 10' by means of monolithic forming by die casting when forming the metal box. The flow passage 36 of the heat dissipation header is sealed by a top 38 which is connected to the flexible tube 18. A liquid is driven between the heat receiving header 14 attached to the heat generating semiconductor device and the flow passage 36 of the heat dissipation header through the flexible tube 18 by means of a liquid driving unit 40 which is separately provided. The driving of liquid may be achieved by a liquid circulation caused by a small pump or by use of the liquid driving mechanism exemplarily shown in FIG. 2. According to this embodiment, an effective heat dissipation may be performed, since thermal resistance due to contact is removed between the heat dissipation header and the metal box wall serving as a heat dissipating surface. In addition, since the flow passage in the heat dissipation header is formed by means of monolithic forming by die casting when forming the metal box, it is possible to form a complicated passage structure.

Figure 5:
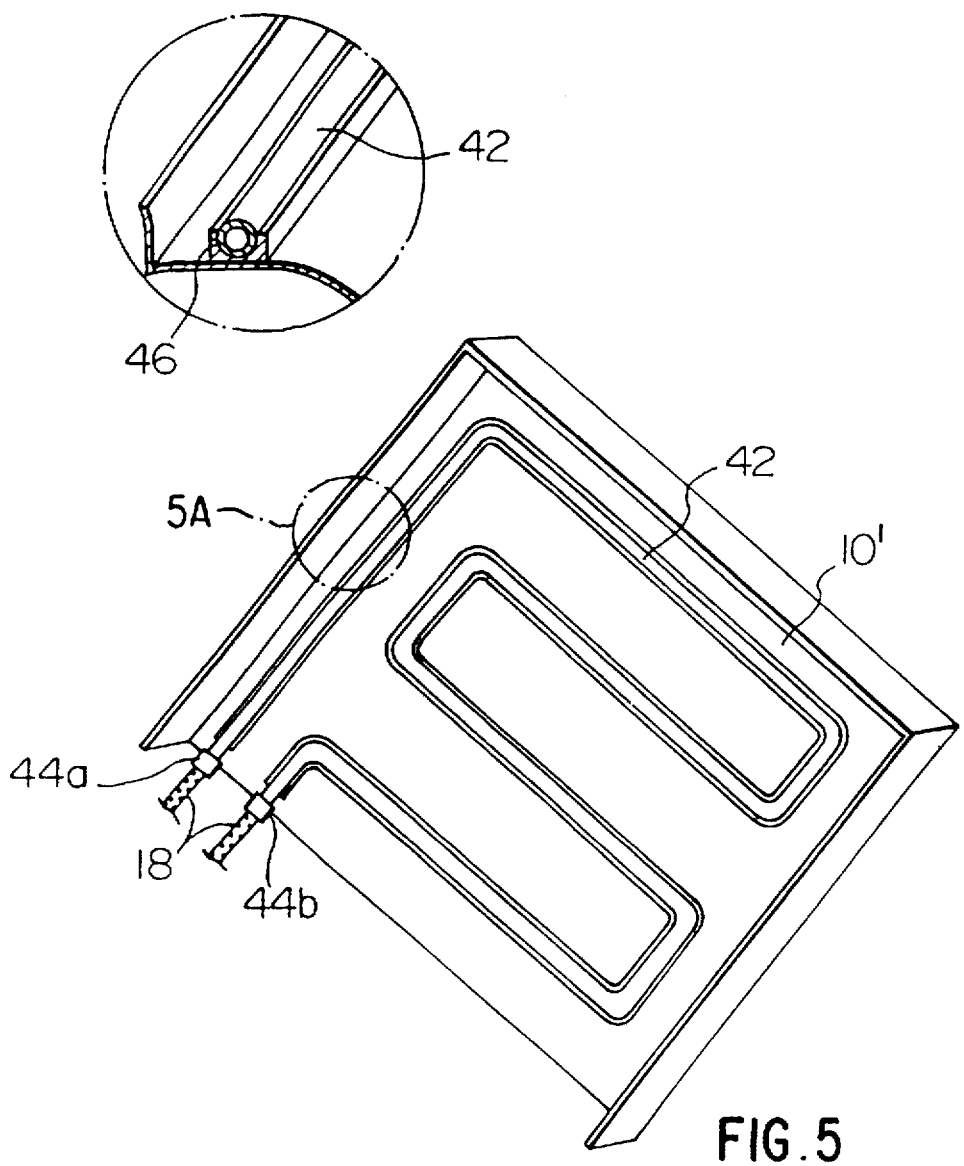
FIG. 5 is a perspective view of a fourth embodiment of the present invention.

FIG. 5 shows a fourth embodiment of the present invention.

In this embodiment, a metal pipe 42 serves as a heat dissipating section for constituting the thermal transport device and it is directly attached to the metal box 10'. The metal pipe 42 is connected to the flexible tube 18 by means of connectors 44a, 44b so that a liquid is driven between the heat receiving header attached to a heat generating semiconductor device and the metal pipe 42 through the flexible tube 18 by means of a liquid driving unit which is separately provided. The metal pipe having an inner diameter (about 2 mm) of the same order as that of the flexible tube is used. On the other hand, a U-shaped groove 46 is provided on the box wall by means of monolithic forming so that the metal pipe may be thermally connected efficiently thereto by fitting it into the U-shaped groove 46, without specifically relying on such means as welding. According to this embodiment, even though a line contact is provided between the heat dissipating section and the metal box body by the metal pipe, heat is diffused extensively into the box wall due to high thermal conductivity of the metal box. Also, it is possible to install a metal pipe constituting a liquid flow passage all over the box wall surface using a simple construction, whereby a large area of the box wall may be effectively used as a heat dissipating surface. As a result, a high heat dissipation capacity may be achieved.

FIG. 6 shows a fifth embodiment of the present invention.

An electronic equipment here includes a wiring board 2 having a plurality of semiconductor devices mounted thereon, a key board 4, a disk unit 6 and a display unit 8 and is contained in a metal box 10'. Of these semiconductor devices mounted on the wiring board 2, a semiconductor device 12 having a particularly large generation of heat is cooled by a thermal transport device which is constituted by a heat receiving header 14, a heat dissipation header 16, a flexible tube 18, etc. The semiconductor device 12 and the heat receiving header 14 are brought into contact with each other with a thermal compound or high heat conduction silicone rubber interposing therebetween so that heat generated at the semiconductor device 12 is efficiently transferred to the heat receiving header 14. Further, the heat receiving header 14 connected to the semiconductor device 12 is connected through the flexible tube 18 to the heat dissipation header 16 which is provided on a box wall on the body side where the wiring boards, etc. are mounted. The heat dissipation header 16 is thermally and physically attached to the metal box wall through a thermal compound or high heat conduction silicone rubber or directly, for example, by means of screw. A flow passage is formed in the interior of the heat receiving header 14 and the heat dissipation header 16 and a liquid is sealed therein. Details of the thermal transport device are similar to those shown in FIG. 2. In the heat dissipation header shown in FIG. 2, however, the liquid driving mechanism defines the total thickness of the heat dissipation header. Therefore, in an equipment, for which only a very narrow mounting space is provided, it is also possible to provide a liquid driving unit separately from the heat dissipation header.

Figure 7:
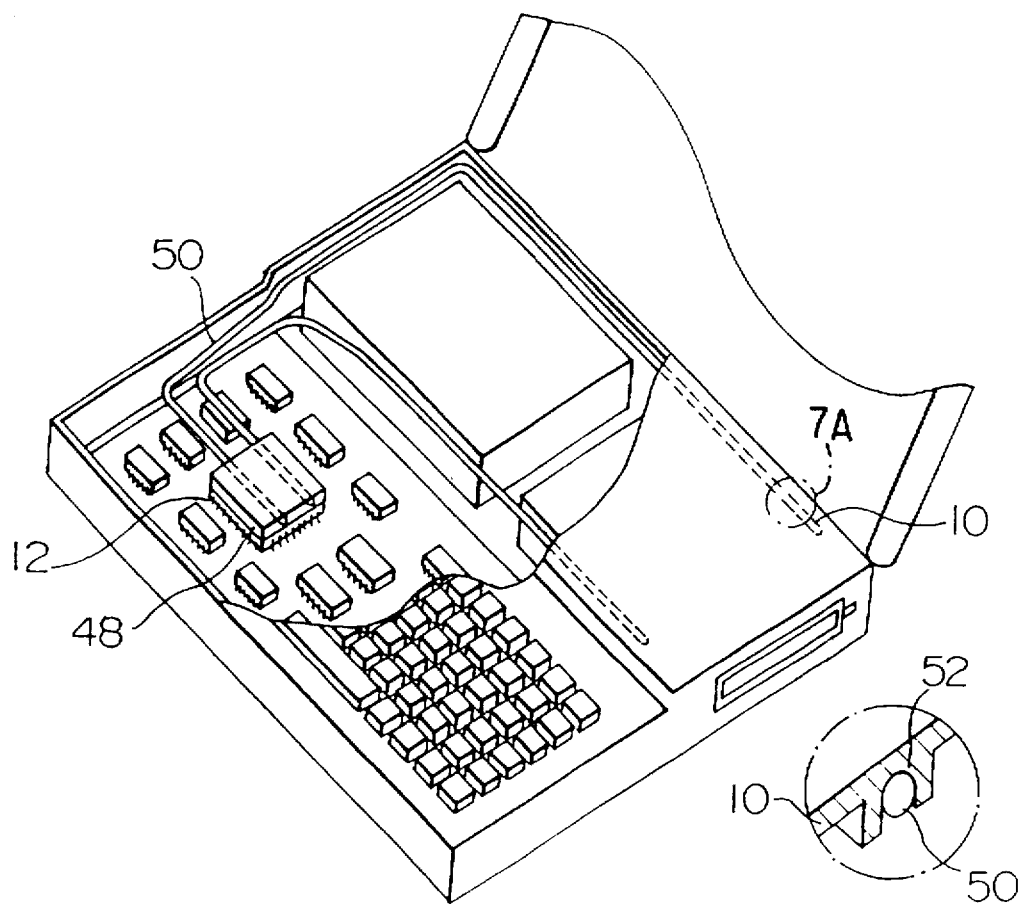
FIG. 7 is a perspective view of a sixth embodiment of the present invention.

FIG. 7 shows a sixth embodiment of the present invention.

In this embodiment, an electronic equipment is constructed similarly as in FIG. 6, and a small diameter heat pipe 50 having a diameter of about 2 mm is used as the thermal transport device. The heat pipe 50 is constituted either by one pipe or by a plurality of pipes and cools the semiconductor device 12 which has a particularly large generation of heat. At an end portion of the heat pipe, heat generated at the semiconductor device is transferred to the heat pipe through an aluminum or copper heat receiving plate 48 so that the surface of the semiconductor device is cooled uniformly to a certain temperature. The heat pipe and the heat receiving plate are connected to each other with a small contact heat resistance by means of welding or fitting. On the other hand, at the heat dissipation side, the heat pipe is directly attached to a wall surface of the metal box body 10 which serves as a heat dissipation surface. A U-shaped groove 52 is provided on the box wall by means of monolithic molding, so that an efficient thermal connection thereof is possible by fitting the heat pipe into the U-shaped groove 52 without specifically relying on such means as welding. It should be noted that, since small diameter heat pipes are used in this embodiment, they may be bent in accordance with arrangement of components, so that each heat pipes can be located respectively at will. According to this embodiment, therefore, heat generated at the semiconductor device may be efficiently transported to the heat dissipation section irrespective of the state of arrangement of components. In addition, even though contact between the heat dissipation section and the metal box body is in a line-like area provided by the heat pipe, a large area of the box wall may be efficiently used as a heat dissipation surface due to the fact that heat is diffused extensively into the box wall because of a high thermal conductivity of the metal box body. For this reason, only an elongate portion in a very limited space suffices as the space for installment and a high heat dissipation capacity may be obtained.

Figure 8:
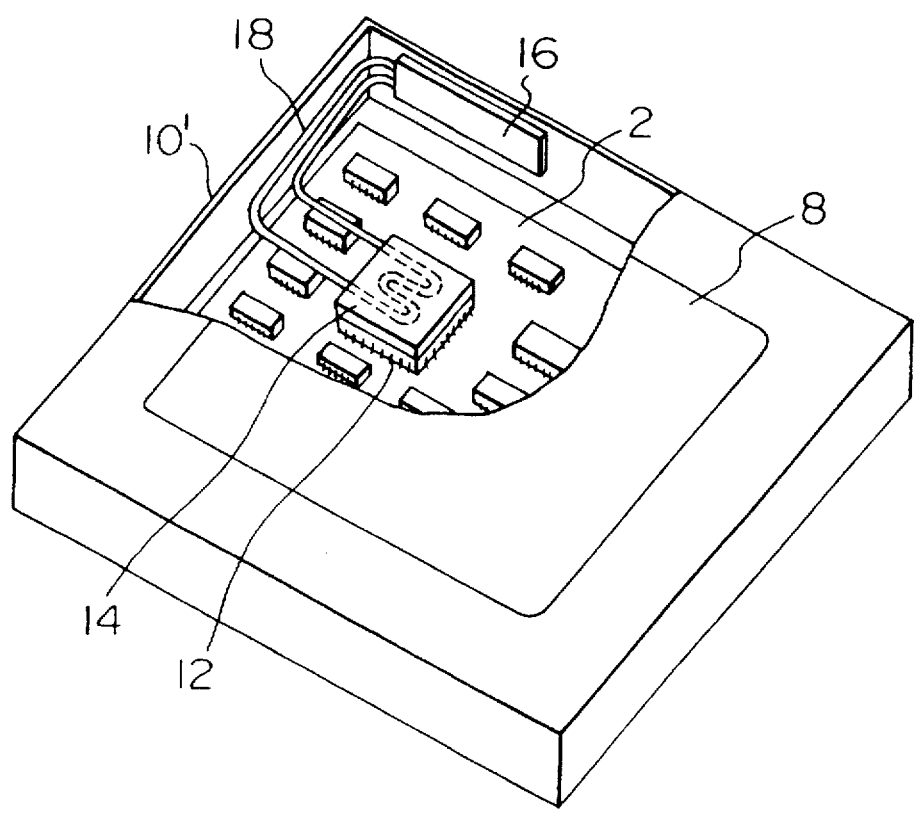
FIG. 8 is a perspective view of a seventh embodiment of the present invention.
Figures 9, 9A:
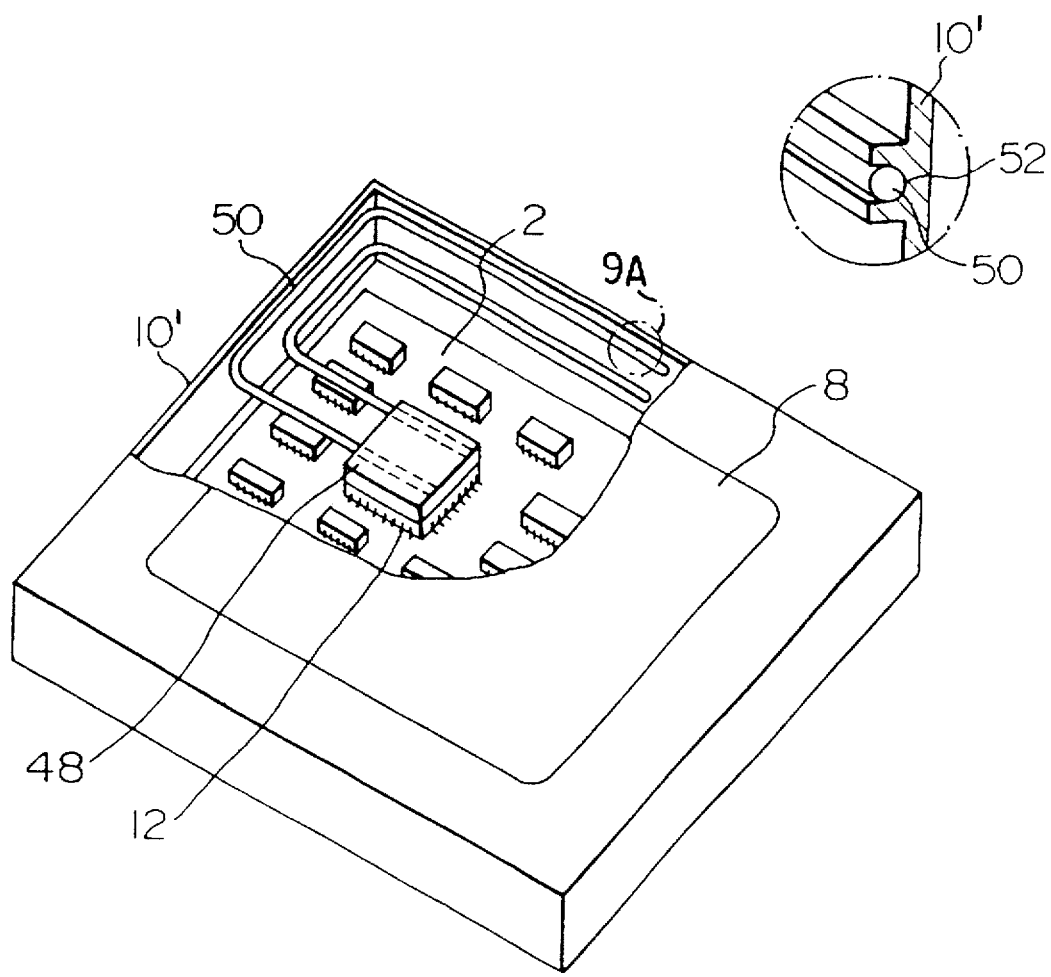
FIG. 9 is a perspective view of an eighth embodiment of the present invention.
FIG. 9A is an isolated enlarged cross-sectional view of the U-shaped groove used in the embodiment of FIG. 9.

Seventh and eighth embodiments of the present invention are shown in FIGS. 8 and 9, respectively.

In an electronic equipment in these embodiments, a display unit 8 is provided at an upper portion of the box body 10' in which wiring board 2, etc. are contained and a packaging space is very limited.

In FIG. 8, of the semiconductor devices mounted on the wiring board 2, a semiconductor device 12 having a particularly large generation of heat is cooled by a thermal transport device which is constituted by a heat receiving header 14, a heat dissipation header 16, a flexible tube 18, etc. The semiconductor device 12 and the heat receiving header 14 are brought into contact with each other with a thermal compound or high heat conduction silicone rubber interposing therebetween so that heat generated at the semiconductor device 12 is efficiently transferred to the heat receiving header 14. Further, the heat receiving header 14 connected to the semiconductor device 12 is connected through the flexible tube 18 to the heat dissipation header 16 which is provided on a wall surface of the box body 10' mounting thereon a wiring board, etc. The heat dissipation header 16 is thermally and physically attached to the wall of the metal box 10 through a thermal compound or high heat conduction silicone rubber or directly, for example, by means of screw. Although its attaching position is located, for example, on a side surface of the box where a relatively large room is left, it is not specifically limited. The reason for this is that a large area of the box wall at the heat dissipating section may be efficiently used as a heat dissipation surface as heat is diffused extensively into the box wall because of high thermal conductivity of the metal box and also that the heat receiving header 14 and the heat dissipation header 16 are connected to each other through the flexible tube 18 irrespective of arrangement of components.

In FIG. 9, on the other hand, an electronic equipment is constructed similarly as in FIG. 8, and a heat pipe 50 is used as the thermal transport device. The heat pipe 50 comprises either one pipe or a plurality of pipes and cools the semiconductor device 12 having a particularly large generation of heat. At an end portion of the heat pipe 50, similarly as in the embodiment shown in FIG. 7, heat generated at the semiconductor device is transferred to the heat pipe 50 through a metal heat receiving plate 48. At the heat dissipation side, on the other hand, the heat pipe is directly attached to an wall surface (such as the body side surface) of the metal box 10 which serves as a heat dissipation surface. A U-shaped groove 52 is provided on the surface of the box 10 by means of monolithic molding. By fitting the heat pipe 50 into the U-shaped groove 52, an efficient thermal connection thereof is possible without specifically relying on such means as welding. According to this embodiment, only an elongate portion suffices to serve as the space for installation of the heat pipe and the metal box so that an efficient heat dissipation is possible even in an electronic equipment, of which space available for heat dissipation within the box is very small.

Figure 10:
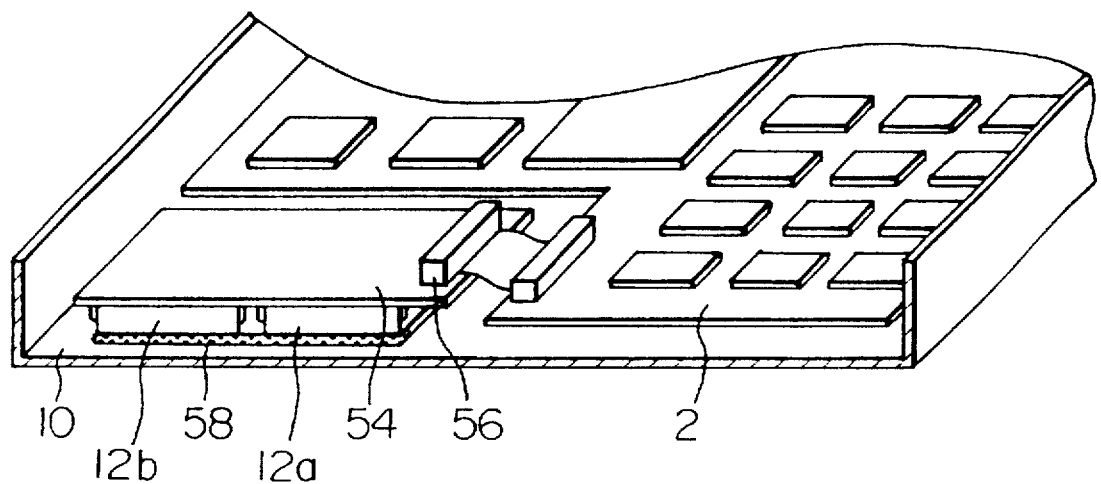
FIG. 10 is a perspective view of a ninth embodiment of the present invention.

FIG. 10 shows a ninth embodiment of the present invention.

In this embodiment, of a wiring board 2 of the electronic equipment, a board including semiconductor devices 12a, 12b having a particularly large generation of heat is separated as another electronic circuit board 54 and the two boards are electrically connected to each other through a connector 56. The separated electronic circuit portion may include a plurality of semiconductor devices considering the operating speed of the circuits. The board 54 including a portion which generates a large quantity of heat is provided so that surfaces of the semiconductor devices having a particularly large generation of heat is disposed in a manner to face the metal box. Sandwiched between the semiconductor device surfaces and the metal box is a high heat conductive flexible member 58 (for example, Si gel or heat conduction grease charged into a bag-shaped film) comprising a member which is flexible and has an excellent thermal conductivity. Although an embodiment, in which a bottom surface portion of the box is used as a heat dissipation surface, is shown in FIG. 10, it is possible according to the present invention to use an upper surface portion or side surface portions of the box as a heat dissipation surface if an adequate space is provided. According to this embodiment, since a plurality of heat generating members and the metal box wall is connected to each other through a flexible member, each of the heat generating members, therefore, is thermally connected efficiently to the metal box wall even if the heat generating members varies in height from one to another. In addition, a high heat dissipation capacity may be obtained and since the metal box wall will not be locally raised to high temperatures heat is diffused extensively into the box wall due to a high thermal conductivity of the metal box body.

Figure 11:
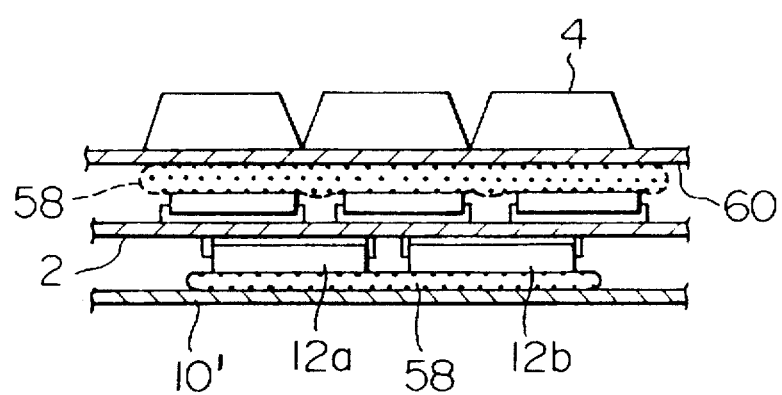
FIG. 11 is a sectional view of a tenth embodiment of the present invention.

FIG. 11 shows a tenth embodiment of the present invention.

In this embodiment, a wiring board 2 for an electronic equipment is provided in a similar construction as in FIG. 10 such that its surface including semiconductor devices 12a, 12b which are high in generation of heat faces the metal box 10'. A high heat conduction flexible member 58 is inserted between the semiconductor device surfaces and the metal box. While, in the embodiment shown in FIG. 11, a bottom surface portion of the box is used as a heat dissipation surface as is the case in FIG. 10, it is also possible that a metal plate 60 supporting the key board 4, for example, is used as a heat dissipation surface and the wiring board 2 and the high heat conduction flexible member 58 are disposed as shown by the broken line.

According to the present invention, heat generated by semiconductor devices which are high in generation of heat may be efficiently transported to a heat dissipation section irrespective of the arrangement of components even in an apparatus, in which the semiconductor devices having a high generation of heat are mounted together with other components within a narrow space. In addition, since the heat dissipation section is connected to the metal box wall, heat is diffused extensively into the box wall so that a large area of the box wall may be efficiently used as a heat dissipation surface and a high heat dissipation capacity may be obtained. Thus, the semiconductor devices can be efficiently cooled.

What is claimed is:

1. A cooling unit for electronic equipment, comprising a first box containing an electronic circuit board, a plurality of semiconductor devices and a keyboard, a second box made of metal material and containing a flat type display unit arranged to face the keyboard in a position in which the first and second boxes face each other to define a closed position with the second box having a wall constituting a lid, said second box having fins with one end contacting the wall and the other ends being free non-contacting ends each extending inwardly toward the display unit, a heat receiving section provided on at least one of said semiconductor devices, a heat dissipation section integrally connected to said wall of said second box so as to be thermally connected to said second box, and at least one thermal transport conduit connecting said heat receiving section and said heat dissipation section to each other and transporting heat therebetween such that the said wall of the second box constitutes a heat dissipation body.

2. A cooling unit for electronic equipment, comprising a first box containing an electronic circuit board, a plurality of semiconductor devices and a keyboard, a second box made of metal and containing a flat-type display unit arranged to face the keyboard in a position in which the first and second boxes face each other to define a closed position with the second box having a wall constituting a lid, said second box having fins with one end contacting the wall and the other ends being free non-contacting ends each extending inwardly toward the display unit, a heat receiving section provided on at least one of said semiconductor devices, a heat dissipation section integrally connected to said wall so as to be thermally connected to said second box, and at least one thermal transport conduit connecting said heat receiving section and said heat dissipation section to each other and transporting heat therebetween.

3. A cooling unit according to claim 2, wherein said heat receiving section and said heat dissipation section are provided therein with liquid passages, and said thermal transport means comprises liquid circulation flexible tubes configured to circulate a liquid between said heat receiving section and said heat dissipation section.

4. A cooling unit according to claim 3, wherein said liquid passages in said heat dissipation section are integrally formed in walls of said second box.

5. A cooling unit according to claim 3, wherein said liquid circulation flexible tubes are housed in said heat dissipation section.

6. A cooling unit according to claim 2, wherein heat dissipation fins are integral with said second box on a reverse side of said display unit opposite a side thereof facing said first box.

7. A cooling unit according to claim 2, wherein heat pipes are connected at one end thereof to said heat receiving section and fitted in U-shaped grooves formed integrally in and along walls of said first box.

\* \* \* \* \*